(12) United States Patent
Rosselli et al.

(10) Patent No.: US 7,405,793 B2
(45) Date of Patent: Jul. 29, 2008

(54) DISCOTIC LIQUID CRYSTAL BASED ELECTRONIC DEVICE USING INTERDIGIT STRUCTURE ELECTRODE

(75) Inventors: Silvia Rosselli, Stuttgart (DE); Gabriele Nelles, Stuttgart (DE); Akio Yasuda, Esslingen (DE)

(73) Assignee: Sony Deutschland GmbH, Cologne (DE)

( * ) Notice: Subject to any disclaimer, the term of this patent is extended or adjusted under 35 U.S.C. 154(b) by 0 days.

(21) Appl. No.: 10/546,581

(22) PCT Filed: Feb. 24, 2004

(86) PCT No.: PCT/EP2004/001819

§ 371 (c)(1),
(2), (4) Date: Jul. 20, 2006

(87) PCT Pub. No.: WO2004/075314

PCT Pub. Date: Sep. 2, 2004

(65) Prior Publication Data

US 2006/0260669 A1    Nov. 23, 2006

(30) Foreign Application Priority Data

Feb. 24, 2003    (EP)    ................... 03004025

(51) Int. Cl.
*G02F 1/1343*    (2006.01)
*G02F 1/13*    (2006.01)
*H01L 29/08*    (2006.01)
*H01L 51/00*    (2006.01)
*H01L 31/042*    (2006.01)

(52) U.S. Cl. ............... 349/141; 349/1; 349/74; 349/77; 349/182; 349/187; 349/189; 349/190; 349/191; 257/40; 136/244

(58) Field of Classification Search .............. 349/33, 349/34, 73, 74, 1, 77, 82, 141, 142, 145, 349/151, 118, 120, 121, 117, 182, 187, 189, 349/190, 191; 136/244; 257/40
See application file for complete search history.

(56) References Cited

U.S. PATENT DOCUMENTS 6,184,957 B1 * 2/2001 Mori et al. ................ 349/118
6,437,123 B1    8/2002 Bock et al. ................ 544/216

(Continued)

FOREIGN PATENT DOCUMENTS

DE    198 09 944    10/1998    ................ 349/1 X (Continued)

OTHER PUBLICATIONS

R. Azumai, M. Ozaki, H. Nakayama, T. Fujisawa, W.F. Schmidt, K. Yoshino: "Time of Flight Study on Carrier generation and transport in Discotic Liquid Crystal" Mol. Cryst. and Liq. Cryst., vol. 366, 2001, pp. 359-367, XP009014768.

(Continued)

*Primary Examiner*—Brian M Healy
(74) *Attorney, Agent, or Firm*—Oblon, Spivak, McClelland, Maier & Neustadt, P.C.

(57) ABSTRACT

The present invention relates to an electronic device, based on discotic liquid crystalline material, to methods of production of such a device, and to uses thereof.

21 Claims, 11 Drawing Sheets

U.S. PATENT DOCUMENTS

Figure 1:
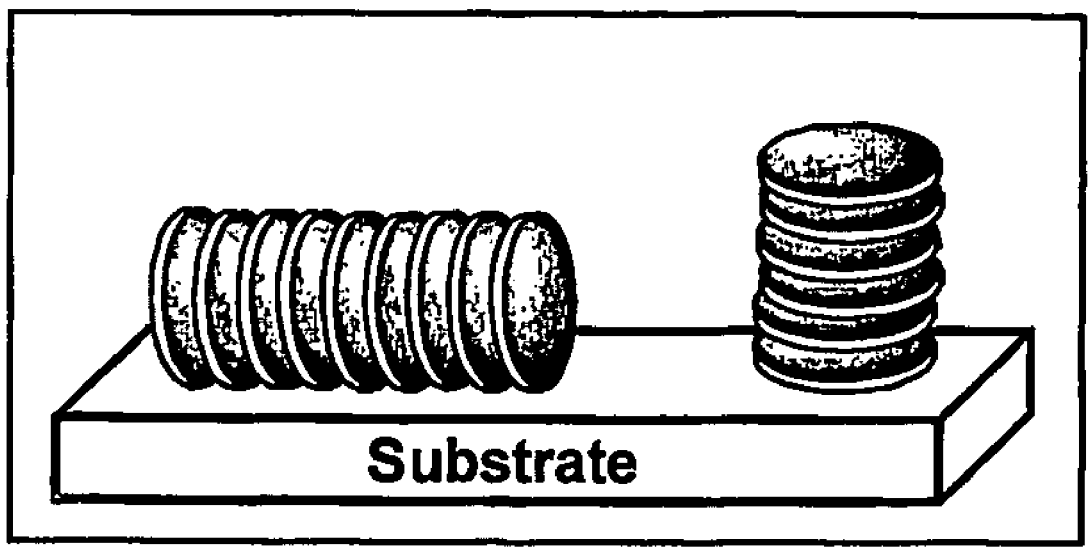

2001/0019320 A1* 9/2001 Lee et al. .................. 345/87
2005/0179855 A1* 8/2005 Helgee et al. ............... 349/172
2006/0260669 A1* 11/2006 Rosselli et al. ............. 136/244

FOREIGN PATENT DOCUMENTS

| EP | 0 364 185 | 4/1990 | ................ 349/1 X |
|---|---|---|---|
| EP | 0 573 201 | 12/1993 | ................ 349/1 X |
| EP | 1 067 132 | 1/2001 | ................ 349/1 X |
| WO | WO 96 06144 | 2/1996 | ................ 349/1 X |

OTHER PUBLICATIONS

R. A. Soref: "Field Effects in nematic liquid crystals obtained with Interdigital Electrodes" Journal of Applied Physics, vol. 45, No. 12, Dec. 1974, pp. 5466-5468, XP009014984.

* cited by examiner

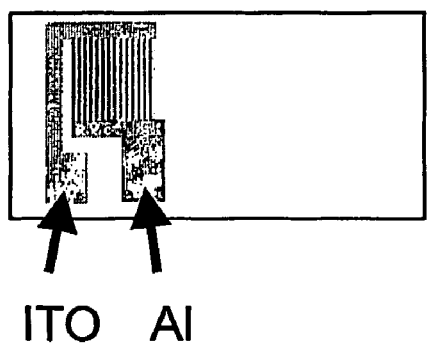 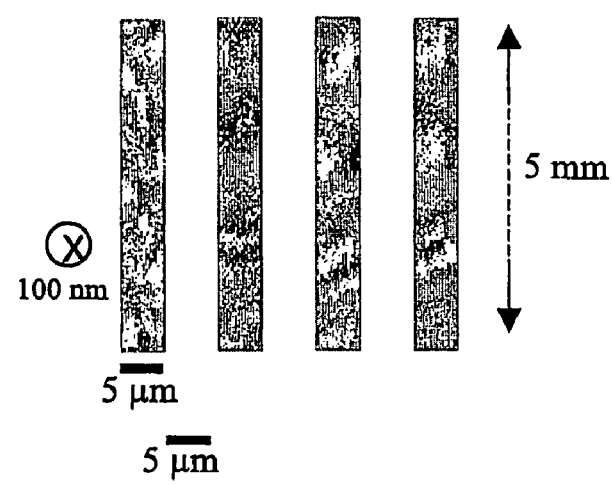
Figure 8 a)                    Figure 8 b)

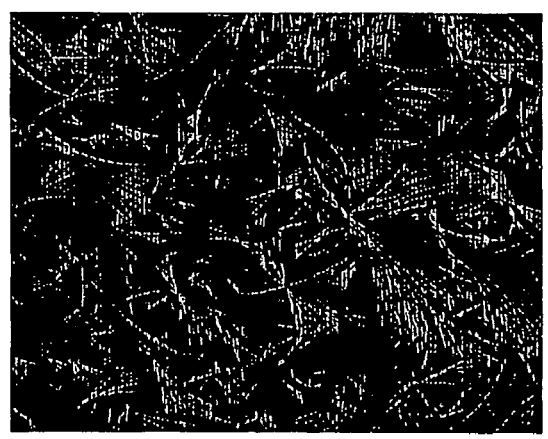
Dipping direction →
Figure 10 a) Figure 10 b)

DISCOTIC LIQUID CRYSTAL BASED ELECTRONIC DEVICE USING INTERDIGIT STRUCTURE ELECTRODE

The invention relates to an electronic device, based on discotic liquid crystalline material, to methods of production of such a device, and to uses thereof.

With the advent of nanotechology and the availability of new materials, the fabrication of electronic device, especially field effect transistors, photovoltaic cells and light emitting diodes (LEDs) has gained new momentum in recent years. Of these, organic photovoltaic (PV) cells (or organic solar cells), which are in a typical geometry made of an organic layer sandwiched between two different electrode materials, have attracted scientific interest since they offer potential advantages of low-cost, large-area deposition, and the compatibility with flexible plastic substrates. Many examples of photovoltaics have been reported in the literature which photovoltaics are made of conduction polymers, mixture of polymer, organic molecules [C. J. Brabec, N. S., Saracifici, J. C. Hummelen, *Adv. Funct. Mater.* 11, 15-26 (2001)], organic molecules [C. W. Tang, *Appl. Phys. Lett.* 48(2), 183-185 (1986); D. Wöhrle, D. Meissner, *Adv. Mater.* 3, 129-138 (1991); T. J. Schaatsma, *Solar Energy Materials and Solar Cells*, 38, 349-351, (1995)] and liquid crystals [B. A. Gregg, M. A. Fox, A. L. J. Bard, *J. Phys. Chem.*, 94, 1586-1598, (1990); K. Petritsch, R. H. Friend, A. Lux, G. Rozenberg, S. C. Moralti, A. B. Holmes, *Synth. Met.*, 102, 1776-7(1999); L. Schmidt-Mende, A. Fechtenkötter, K. Mullen, E. Moons, R. H. Friend, J. D. MacKenzie, *Science,* 293, 1119-22 (2001)].

One species of organic compounds has attracted recent attention, i.e. discotic liquid crystalline materials, e.g. in the field of fabrication of field effect transistors (FETs). This is due to the conductivity behaviour which is displayed by these discotic molecules. In general, discotic molecules (disc-shaped), show a great difference between length, in this case the height of the disc, and breadth, the diameter. They usually consist of a rigid, flat core unit and flexible side chains, which are surrounding this core. The core unit is mostly, but not necessarily, aromatic, for example triphenylene or phthalocyanine. To ensure the disc-shaped geometry of the molecule, the core is often symmetric, and an appropriate number of side chains are used. The physical properties can be influenced over a wide range by variation of the core and/or the side chains. Hence, discotic molecules are also anisotropic and thus potential mesogens i.e. they have the capability of forming a liquid crystalline phase. Discotic liquid-crystalline materials are the only type of liquid crystals that fulfill the prerequisite of large anisotropic by $\pi$-$\pi$interactions. The interdisc stacking interaction in discotics is several orders of magnitude larger than the intercolumnar interactions. This criterion is fulfilled by the phase separation induced by the flexible side chains, whose van der Waals interactions are severely weaker than any of the other interactions. Discotics with an extended aromatic core have, therefore, the best design elements for forming supramolecular polymeric assemblies in solution based on $\pi$-$\pi$ interactions [L. Brunsveld, B. J. B. Folmer, E. W. Meier, *MRS Bulletin,* 49-53, (2000)].

With respect to the aforementioned conductivity in discotic molecules, in 1994, Adam et al. reported high charge carrier (hole) mobility in the liquid crystalline phase of a discotic molecule (hexa-hexylthio tripheny-lene, HTTP) based on time of flight (TOF) measurements [D. Adam, P. Schuhmacher, J. Simmerer, L. Haeussling, K. Siemensmeyer, K. H. Etzbach, H. Ringsdorf and D. Haarer Nature 371, 141-143 (1994)]. The mobility in HTTP increased by a factor of 10 at the transition from the liquid to the hexagonal discotic phase and gains further two orders of magnitude in a higher ordered discotic phase. With the exception of organic single crystals [N. Karl and J. Ziegler, Chem. Phys. Lett. 32, 438-442 (1975)] the reported mobility (0.1 $cm^2V^{-1}s^{-1}$) for photo-induced charge carriers of HTTP was higher than for any other organic systems reported at the time. The distance between adjacent discs in a column was found to be 3.6° A; whereas the distance between the columns was 21.7° A.

As a consequence, charge (and exciton) transport is expected to occur preferably along the columns whereas the mobility in directions perpendicular to column axes can be more than 500 times smaller [N. Boden, R. C. Borner, R. J. Bushby and J. Clements, *J. Am. Chem. Soc.* 116, 10807-8 (1994)] since the excited species have to tunnel through a saturated hydrocarbon mantle (the insulating side chains). Such columns may be used to transport efficiently not only carriers but also excitons and ions [C. F. van Nostrum *Adv. Mat.* 8, 1027-1030 (1996)].

A key parameter to the application of discotic molecules as semiconductors in electronic devices is their relative orientation onto a substrate which can be seen in FIG. 1.

Figure 2:
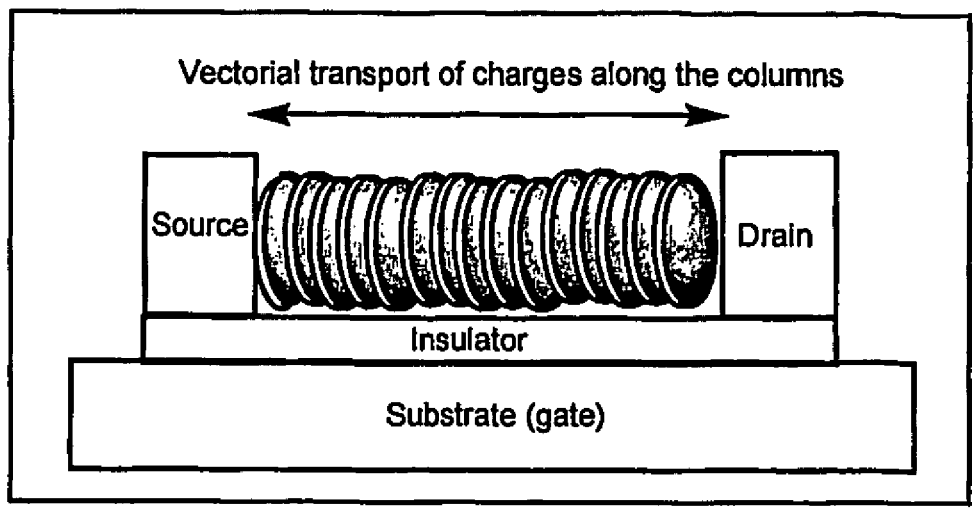
Figure 2:
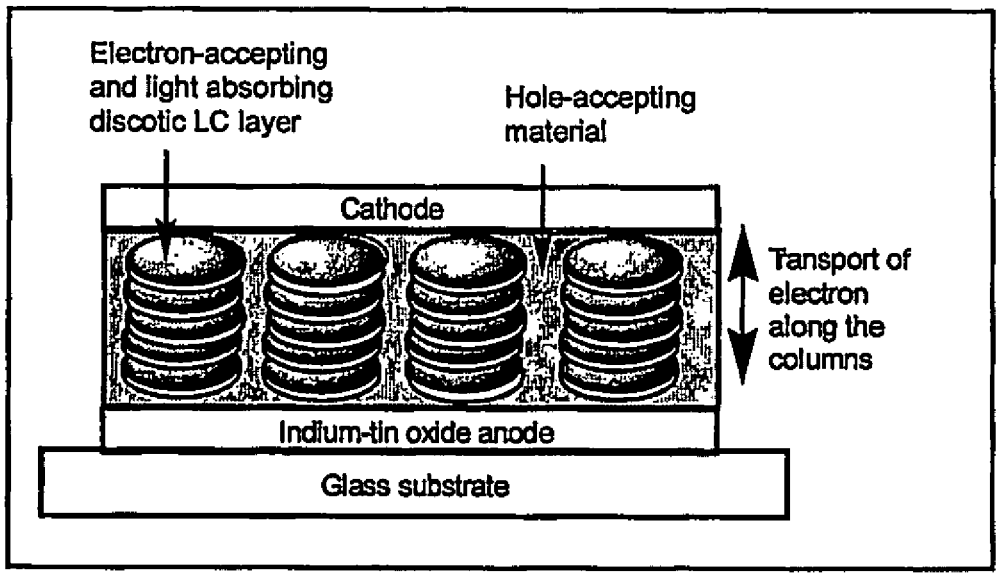

This is due to the unidimensional conduction mechanism along the columns of stacked disks. It is then crucial that these columns effectively connect to electrodes. Two extreme cases can be envisaged: either the disks are oriented homeotropically (i.e. "face-on") or homeogeneously (i.e. "edge-on"). The desired orientation depends on the structure of the device considered. Generally, a homeotropic orientation is suitable for FET, while a homogeneous orientation is suitable for photovoltaic devices as can be seen in FIG. 2.

With respect to the use of discotic liquid crystalline materials in solar cells, a double layer photovoltaic device using a discotic liquid crystals active semi-conductacting layer has been presented in 1999 [K. Petritsch, R. H. Friend, A. Lux, G. Rozenberg, S. C. Moratti, A. B. Holmes., *Synth. Met.* 102, 1779-7(1999)]. Such a device is able to harvest light from the UV to the near infrared with a quantum efficiency approaching 0.5%.

A high external quantum efficiency (EQE) of over 34% at 490 nm was reported for a self-organized liquid crystal organic solar cell by Schmidt-Mende et al. [L. Schmidt-Mende, A. Fechtenkötter, K. Mullen, E. Moons, R. H. Friend, J. D. MacKenzie, *Science,* 293, 1119-22 (2001)], who used bilayer of liquid crystalline hexaphenyl-substituted hexabenzocorone (HBCPhC12) as an electron donor and a perylene dicarboxylic acid diimide derivative as an electron acceptor in the active layer of the cell. The HBC-PhC12 has a disc-like structure and forms in room temperature liquid crystalline phase, a discotic liquid, where the molecules self-organize into a columnar structure. This structure forms, because the flat shape of the molecules allows the molecular $\pi$-orbital sticking out of the plane of each molecule to form a firm bond between molecules in adjacent layer in the same fashion as in the graphite structure.

None of the reported devices have been particularly optimized with respect to the orientation of the discs and the possibility of fabricating such discotic liquid crystal based electronic devices, e.g. solar cells on a large scale.

Accordingly it has been an object of the present invention to provide for an electronic device having an electrode geometry that matches the preferential orientation of discotic liquid crystalline material. It is furthermore an object of the present invention to provide for an electronic device that is easy to fabricate.

All these objects are solved by an electronic device, comprising:
- a substrate having a surface,
- an electrode array arranged on the surface of the substrate such that parts of the electrode array are arranged in an interdigitating and/or meandering and/or parallel fashion,
- at least one layer of at least one discotic liquid crystalline material, the at least one material forming columns, each column having a longitudinal axis, the at least one layer being arranged on the surface of the substrate in a manner such that the longitudinal axes of the columns are parallel to the surface and such that parts of the electrode array are connected to each other through the columns in a conductive manner, the conduction mainly occurring along the longitudinal axes of the columns.

Preferably the columns are aligned uniaxially, with their longitudinal axes being aligned parallel or roughly parallel.

In one embodiment, the parts of the electrode array are electrode fingers, wherein preferably, the electrode array comprises at least two electrode fingers, more preferably, at least three electrode fingers, most preferably, a plurality of electrode fingers.

In one embodiment, the plurality of electrode fingers form at least one comb-like structure, wherein preferably the plurality of electrode fingers form two comb-like structures interdigitating with each other, or the plurality of electrode fingers form one comb-like structure and one meander-like structure interdigitating with each other.

In one embodiment, the two comb-like structures lie opposite each other, with the electrode fingers of each comb-like structure facing each other.

In one embodiment, the electrode array is made of at least one metal oxide.

In one embodiment, the electrode array is made of at least one metal.

In one embodiment, the electrode arrays is made of at least one metal oxide and/or at least one metal.

In one embodiment, the electrode array is made of at least two metals.

Preferably, the at least one metal oxide and/or the at least one metal is selected to match the work function of the electronic device.

In one embodiment, the metal(s)/metal oxide(s)/ is (are) selected from the group comprising gold, silver, aluminum, ion, copper, platinum, zinc, tin, calcium, magnesium, indium doped tin oxide (ITO), fluorine doped tin oxide (FTO), doped zinc oxide (ZnO), and undoped zinc oxide (ZnO).

In one embodiment, the electrode fingers are made of at least one metal and/or at least one metal oxide, preferably two metals and/or two metal oxides, as defined above.

In one embodiment, the average distance between two adjacent electrode fingers is in the range of from 1 μm-100 μm, preferably 2 μm-30 μm, most preferably 3 μm-10 μm.

Preferably, there are two or more layers of the same or different discotic liquid crystalline material, wherein one layer is on top of the other layer of discotic liquid crystalline material.

Preferably, the substrate is selected from the group comprising glass, quartz, flexible substrats (e.g. polyethylene terephtalate (PET), polyethylene naphthalate (PEN), polyethersulfone (PES), stainless steel), and silicon.

In one embodiment, the substrate has been surface modified. Preferably, it has been surface modified, to achieve uniaxial alignment. This can be done by rubbing of unmodified substrate, coating with teflon and/or polyimide, shearing, coating with small molecules (silanisation, Langmuir-Blodgett-techniques and Langmuir-Schäfer-techniques, self-assembling) above or underneath the electrode structure.

Preferably, the uniaxial alignment of columns with the axes being parallel aligned is achieved by laser irradiation, exposition to magnetic field, drop casting, spin coating, Langmuir-Blodgett-techniques, Langmuir-Schäfer-techniques, self-assembling of or at unmodified and/or modified substrates.

Furthermore the objects of the present invention are solved by the use of an electronic device according to the present invention as a solar cell, a field effect transistor, a sensor and/or a light emitting diode.

Furthermore the objects of the present invention are solved by a method of fabricating an electronic device, comprising the steps:
- a) providing a substrate having a surface,
- b) depositing at least one layer of a discotic liquid crystalline material on the surface,
- c) depositing an electrode array on the surface such that parts of the electrode array are arranged in an interdigitating and/or meandering and/or parallel fashion.

Preferably, steps b) and c) are in reverse order.

In one embodiment, the at least one layer of discotic liquid crystalline material is aligned such that columns of the discotic liquid crystalline material are formed, each column having a longitudinal axis, which columns are aligned uniaxially, wherein preferably, the longitudinal axes of the columns are parallel to the surface of the substrate, and wherein, more preferably, the longitudinal axes of the columns are perpendicular to the electrode array, in particular to electrode fingers formed by the electrode array.

In one embodiment, parts of the electrode array are connected to each other through the columns in a conductive manner, said conduction mainly occurring along the longitudinal axes of the columns.

In one embodiment, the uniaxial alignment occurs as step d), wherein preferably, the alignment of the discotic liquid crystalline material occurs by a method selected from the group comprising laser-irradiation, exposition to magnetic field, drop casting, spin coating, Langmuir-Blodgett-techniques, Langmuir-Schäfer-techniques, self-assembling of or at unmodified and/or modified substrates.

Preferably, the uniaxial alignment (step d) occurs after depositing the discotic liquid crystalline material (step b), or concomitantly, wherein, preferably, the substrate is unmodified or pre-aligned.

Furthermore the objects of the present invention are solved by an electronic device produced by the method according to the present invention.

Furthermore the objects of the present invention are solved by the use of an electronic device produced by the method according to the present invention as a solar cell, a field affect transistor, a sensor and/or a light emitting diode.

The inventors have surprisingly found that discotic liquid crystalline materials prefer a homogeneous orientation, when applied to a substrate, irrespective of the previous treatment of the substrate surface or the application technique used for the liquid crystalline material. Consequently, the suggested electrode geometry according to the present invention matches this preferential orientation of the discotic liquid crystalline columns much better than the electrode geometries previously used. The electronic devices according to the present invention are much easier to fabricate, because they do not require the laborious conversion of discotic columns from the homogeneous alignment to the homeotropic alignment. Furthermore, if the electronic devices according to the present invention are for example to be used as photovoltaic cells, they do not require a transparent substrate or electrode, because these are not barriers to the irradiating light.

As used herein the term "interdigitating fashion" is meant to describe any arrangement of two or more entities having protrusions that engage with each other (interdigitate each other). The term "meandering" is meant to signify that the electrode array follows a path of alternating right-hand-curves and left-hand-curves. The phrase "parts of the electrode array are connected to each other through said columns in a conductive manner" is meant to signify that by a connection through the column between the parts of the electrode array, a conduction (meaning the transport of electrons, holes, ions and/or excitons) can occur. Preferably the conduction is measurable by conventional means. An exciton is a two-particle-state, consisting of an excited negative electron in the conducting band and a remaining positive hole (or deficiency) in the valency band. The "longitudinal axis" of a column of discotic liquid crystalline material is the axis along the length of the column. Longitudinal axes are "aligned parallel or roughly parallel", as used herein, if their orientation differs by less than 10°, preferably 5°. As used herein, an "electrode finger" is an element of the electrode array which protrudes from a base. A "comb-like structure" is meant to signify that the arrangement of electrode fingers resembles the teeth of a comb. For example, if the electrode fingers form two comb-like structures, the teeth of each comb can interdigitate each other. Similarly a comb-like structure can interdigitate a meander-like structure. It is clear to someone skilled in the art that an electrode finger or several fingers may also bend, with such a finger forming a curved structure. Such curved structures may then also interdigitate each other. Another pattern that may be formed by the electrode array according to the present invention is the "Greek key" motif, a pattern that has been found on ancient Greek pottery. Such pattern is for example described in T. Creighton "Proteins", W.H. Freeman, $2^{nd}$ edition, 1993, pages 227-228. For the purposes of the invention, all types of electrode geometries can be used as long as the discotic liquid crystal columns connect the fingers of the electrode array in a conductive manner. As used herein, conduction is said to "mainly occur along the longitudinal axes of the columns", if the conduction along the longitudinal axes is greater by at least one order of magnitude (i.e. ten times) than the conduction in a direction perpendicular to the longitudinal axes.

As used herein, the term "homogeneous orientation" of a discotic liquid crystalline material is meant to signify that the columns formed by the liquid crystalline material are orientated on a substrate/surface such that the longitudinal axes of the columns are parallel to the substrate/surface. The term "homeotropic orientation" of a discotic liquid crystalline material is meant to signify that the columns formed by the liquid crystalline material are orientated on the surface/substrate such that the longitudinal axes of the columns are perpendicular to the surface/substrate.

Figure 4:
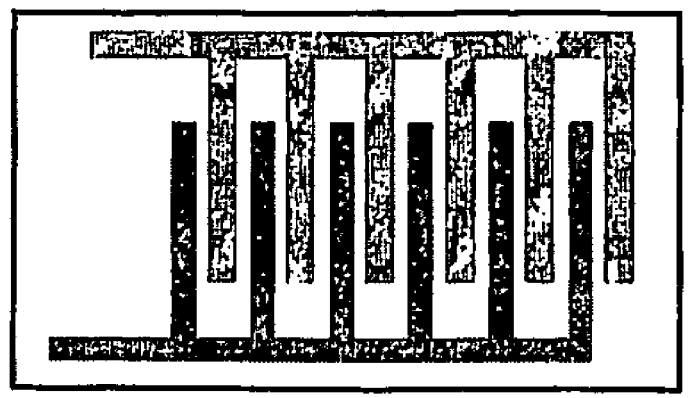
Figure 4:
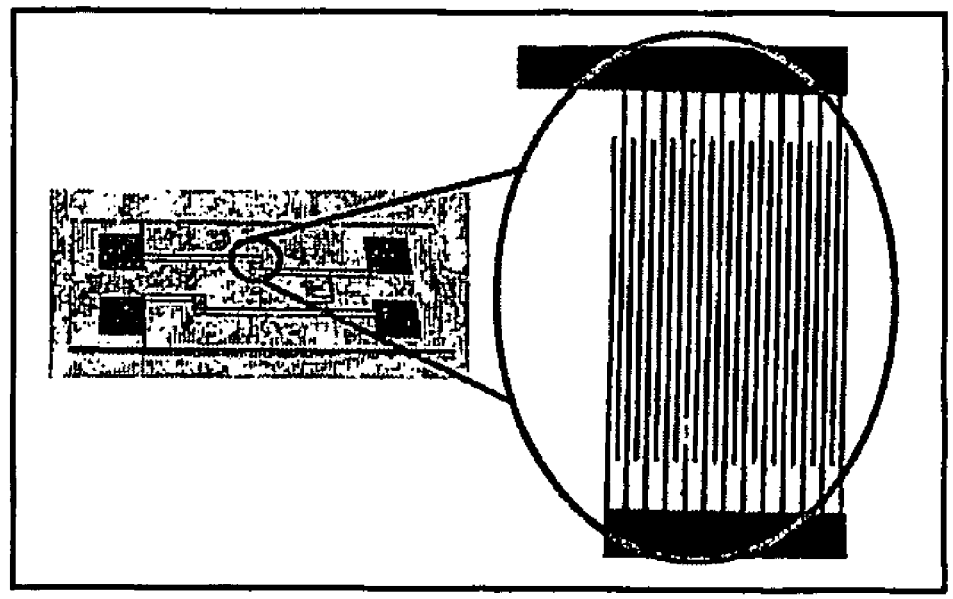

It is clear to someone skilled in the art, that many geometries of the aforementioned kind (interdigitating, meandering, parallel and any combination thereof) fulfill the criteria of the present invention. One example of such a geometry is shown in FIG. 4 according to the present invention. An electrode array is furthermore characterized by the fact that it does not form a sandwich structure on the substrate, in the sense that one or several electrodes or electrode fingers are on top of each other, e.g. in a layered structure. Instead, all electrodes or electrode fingers of an electrode array according to the present invention, lie in one plane/layer on the substrate, which plane/layer is parallel to the surface of the substrate.

The type of discotic liquid crystalline material used for the electronic device according to the present invention is not essential, provided that it shows the aforementioned discotic behaviour and is able to form columns and is conductive along the longitudinal axis of the columns, as mentioned above. Examples for useful discotic liquid crystalline materials are hexaalkoxy-triphenylenes, multiines, truxenes, phenanthrenes, antracenes, perylenes, alkylated hexabenzo-coronenesphthalocyanines, porphyrins and diquinoxalino phenazines (HATNA) and derivatives thereof.

Useful liquid crystalline material are known to someone skilled in the art and can be identified without undue burden of experimentation. Likewise the nature of the substrate is not essential, provided that it allows the deposition of at least one layer of a discotic liquid crystalline material in such a manner that the longitudinal axes of the columns of the discotic liquid crystalline material can be parallel to the surface of the substrate. Examples for useful substrates include, without being limited thereto glass, quartz, flexible substrates (e.g. polyethylene terephthalate (PET), polyethylene naphthalate (PEN), polyethersulfone (PES), stainless steel), and silicon. The surface of the substrate can of course also be modified by any suitable technique, known to someone skilled in the art. Examples for such surface modification techniques are, without wanting to be restricted thereto, rubbing of the unmodified substrate, coating with teflon or polyimide with or without rubbing afterwards, shearing, coating with small molecules (silanisation, Langmuir-Blodgett- and Langmuir-Schäfer-techniques, self assembling) above or underneath the electrode structure.

In order to orientate the columns of the discotic liquid crystalline material(s) so as to align them, a whole battery of techniques can be used which are well known to someone skilled in the art. These include for example Langmuir-Blodgett- and Langmuir-Schäfer-techniques [N. C. Maliszewskyi, O. Y. Mindyuk, P. A. Heiney, J. Y. Josefowicz, P. Schumacher, H. Ringsdorf, *Liquid Crystal*, 26, 31-36 (1999)], self-assembly of discotic liquid crystalline materials on unmodified or modified substrates [H. Schönherr, F. J. B. Kremer, J. A. Rego, H. Wolf, H. Ringsdorf, M. Jaschke, H. J. Butt, E. Bamberg *J. Am. Chem. Soc.*, 118, 13051-13057 (1996), alignment by exposition to magnetic field (M. B. Boamfa, P. C. M. Christianen, J. C. Maan, H. Engelkamp, R. J. M. Nolte, *Physica B*, 294-295, 343-346 (2001)], homeotropic alignment, i.e. face-on, and homogeneous alignment, i.e. edge-on, by using specific surfaces [C. Vauchier, A. Zann, P. Le Barny, J. C. Dubois, J. Billard, *Mol. Cryst. Liq. Cryst.*, 66, 103-114 (1981)], surface-assisted orientational photo-control of discotic liquid crystals [S. Furumi, K. Ichimura, H. Sata, Y. Nishiura, *Appl. Phys. Lett.*, 77, 2689-2691 (2000)], drop casting, spin coating, rubbing, rubbing with cloth and polarised confocal Raman spectroscopy. A preferred technique is zone casting (J. Burda, A. Tracz, T. Pakula, J. Ulanski, M. Kryszewski, J. Phys. D., 16, 1737, (1983); Patent PRL 131 986 (1981.05.15), reference to which is made hereby.

As used herein, the term "matching the appropriate work function of the electronic device" is meant to signify that the energy of the electrodes has to match the energy level of the discotic material(s) so that the electron and hole can be separated and be injected into a external circuit.

It is clear to some skilled in the art, that if the electronic devices according to the present invention are for example used as photovoltaic cells, the arrangement described in the claims and the specification needs to have an additional layer, which shields the electrode(s) and the layer(s) of liquid crystal material(s) from the surroundings. Such layer, in the case photovoltaic cells, needs to be transparent and, possibly, needs to have a sealing function.

Reference is now made to the figures, wherein

FIG. 1 shows possible disc orientations within a thin film, with either a homeotropic (i.e. "face-on")-orientation or a homogeneous (i.e. "edge-on")-orientation relative to the surface of the substrate, FIG. 2 shows a field effect transistor (FET) having a homogeneous orientation of the discotic liquid crystalline material (FIG. 2a), and a photovoltaic device having a homeotropic orientation of the discotic liquid crystalline material (FIG. 2b)

Figure 3:
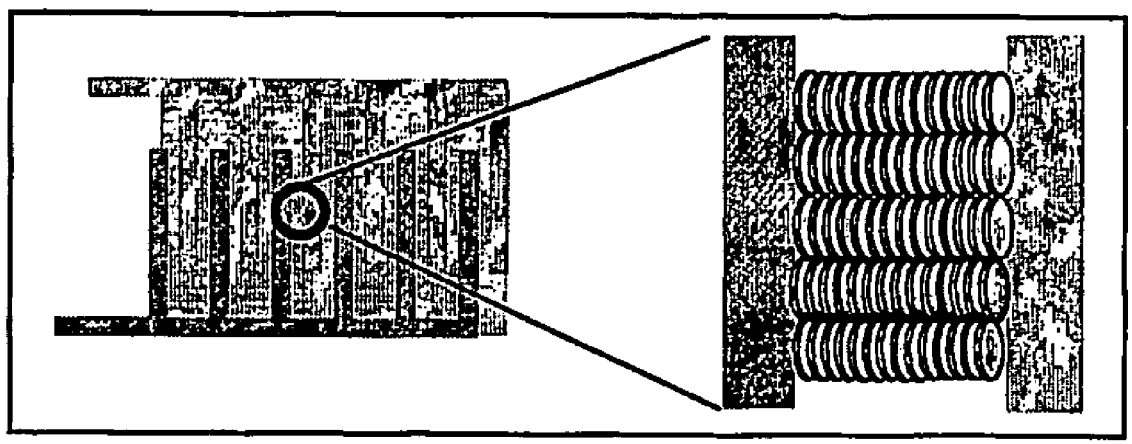
Figure 5:
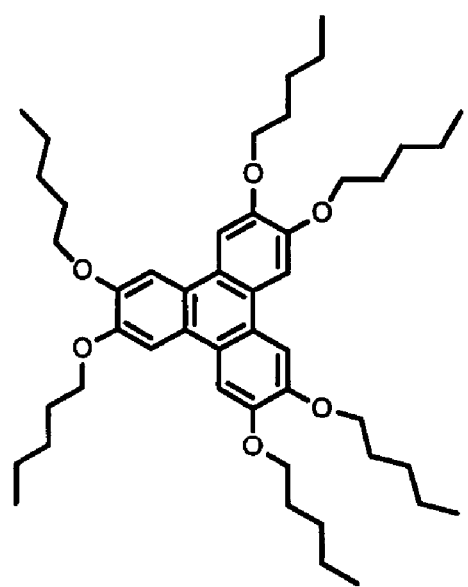
Figure 5:
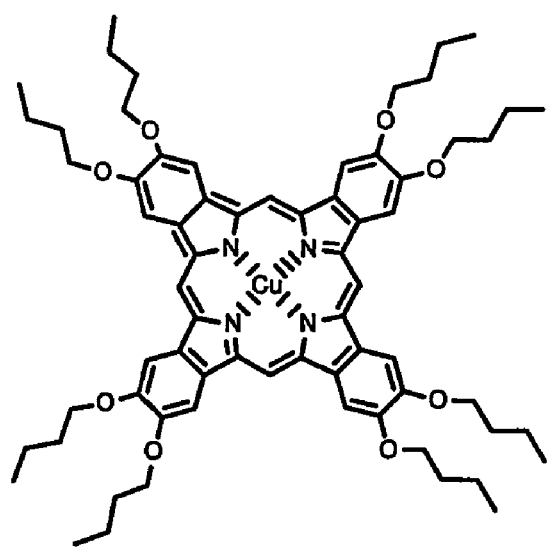
Figure 6:
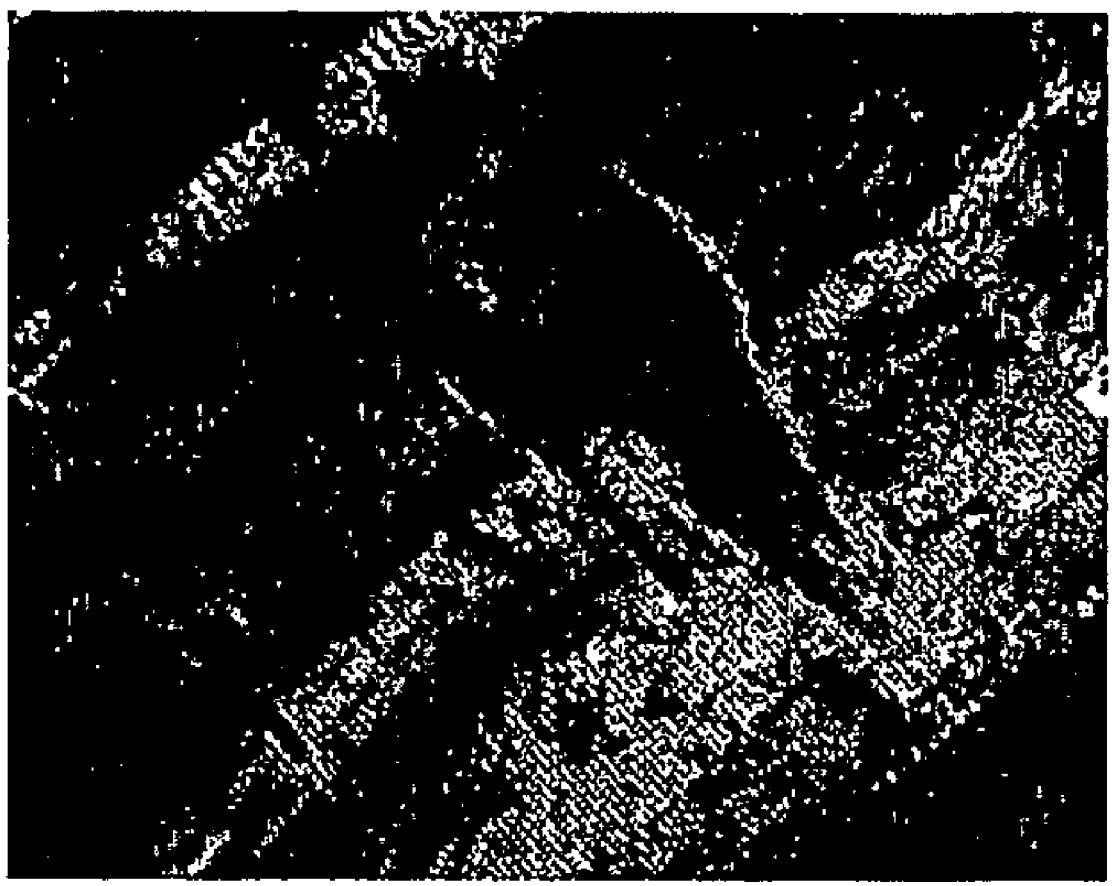
Figure 7:
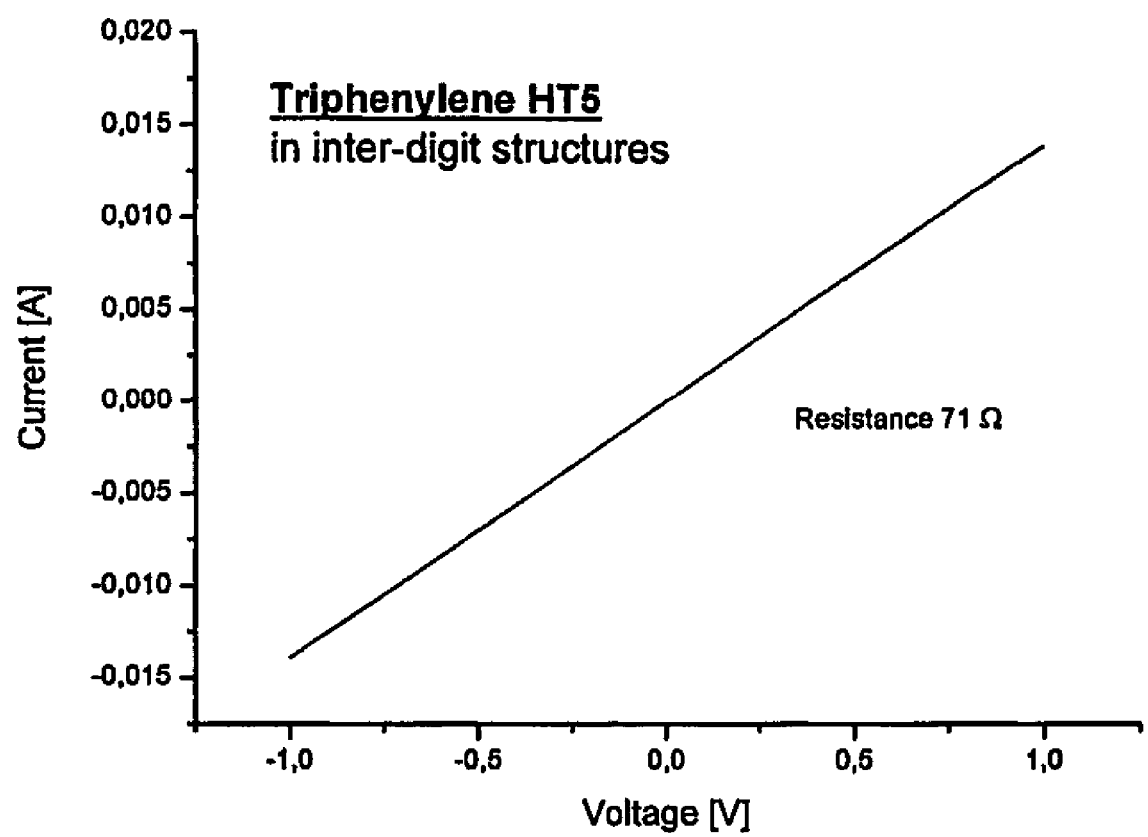

FIG. 3 shows a schematic view of an interdigitating structure according to the present invention, the structure being coated with an organic layer consisting of two different types of discotic liquid crystalline material (differently shaded), and FIG. 4 shows a schematic representation (FIG. 4a) and a photographic representation (FIG. 4b) of an interdigitating structure according to the present invention, FIG. 5a) shows the structure of the liquid crystalline material 2,3,6,7,10,11-Hexakis(pentoxyl)triphenylene, FIG. 5b) shows the structure of the liquid crystalline material Cu(II) 1,4,8,11,15,18,22,25, octa-butoxy 29H, 31H phthalocyanine FIG. 6 shows the interdigit structure of FIG. 4b with the liquid crystalline material between the fingers of the interdigit structure, and FIG. 7 shows a current-voltage plot of the interdigit structure of FIG. 6.

Figure 9:
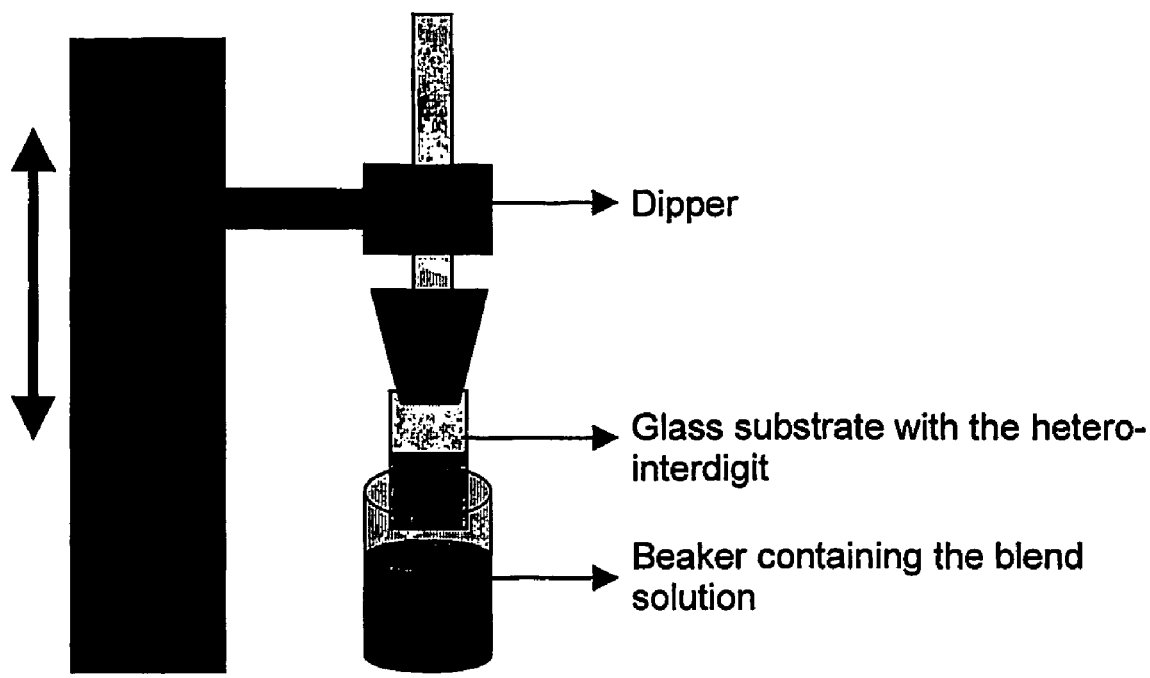
Figure 11:
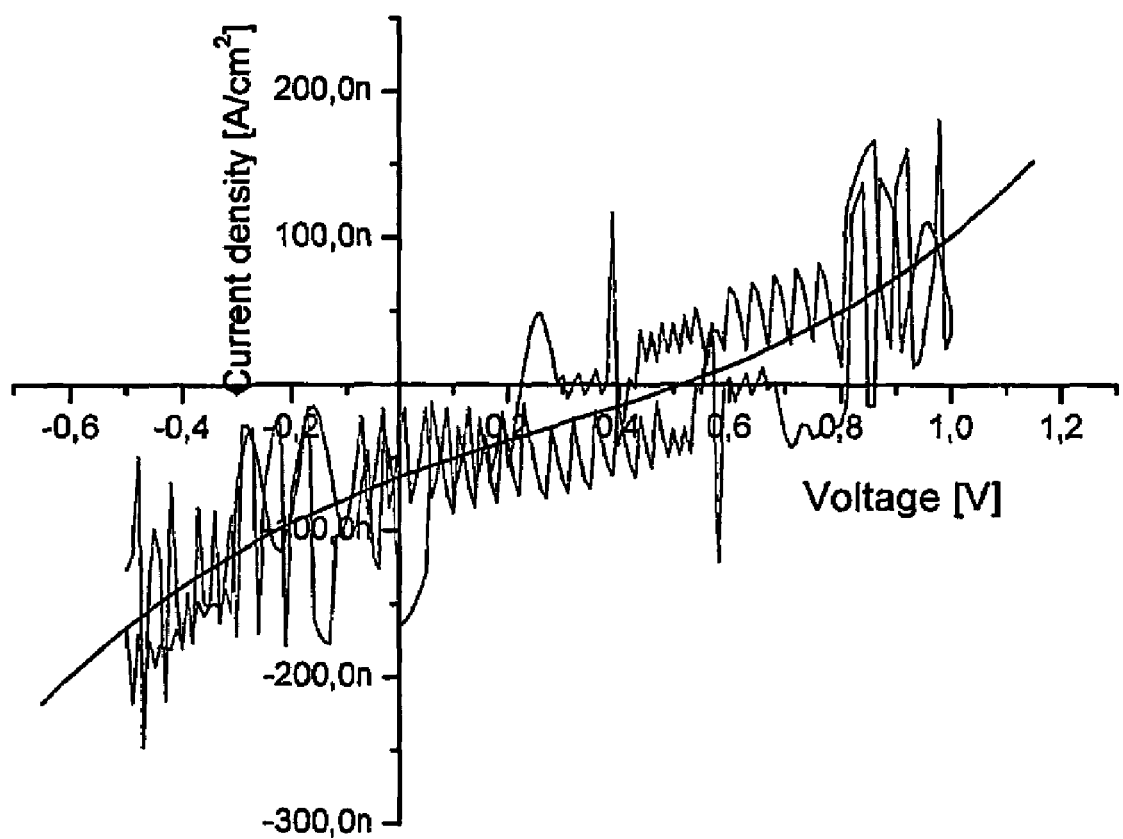

FIG. 8 shows the structure of a glass substrate (8a) having a hetero-interdigit electrode which glass substrate is used for producing a solar cell as described in example 2, the dimensions of the electrode are shown in FIG. 8b, with "100 nm ⊗" denoting the height of the electrodes perpendicular to the plane of the substrate, FIG. 9 shows a dip casting apparatus for obtaining oriented discotic liquid crystal layers, FIG. 10 shows oriented films of a blend of the liquid crystalline materials of FIG. 5, prepared using the dip casting apparatus of FIG. 9, on silanised glass (10a), on silanised substrate with the heterointerdigit (10b), FIG. 11 shows the current-voltage-characteristics of a solar cell prepared according to example 2.

The invention will now be better understood by reference to the following specific examples which is intended to illustrate, not to limit the invention.

EXAMPLE 1

The liquid crystal 2,3,6,7,10,11-hexakis(pentoxyl)triphenylene (Triphenylene HT5) shown in FIG. 5a) was used in the following experiment.

It has the following temperature transition:
K->Dp 89° C. (crystalline phase->liquid crystalline phase)
Dp->I 122° C. (liquid crystalline phase->isotropic liquid phase)

A small amount of this material was heated up to 100° C. and oriented on the top of the interdigit structure of FIG. 4b by distributing it by moving a thin cover glass with a certain pressure. The interdigit structure is made of gold with an interdigit distance of 5 μm. The material was distributed so that the direction of the longitudinal axes of the columns was parallel to the substrate surface, and perpendicular to the finger of the interdigit structure. This is shown in the FIG. 6.

The current-voltage characteristic of the interdigit structure was measured and is reported in FIG. 7.

The resistance that can be calculated is 71 Ω and this is an indication that the material in this geometry shows a good conductivity.

EXAMPLE 2

The liquid crystal 2,3,6,7,10,11-hexakis(pentoxyl)triphenylene(1) and the Cu (II) 1,4,8,11,15,18,22,25,octa-buthoxy 29H, 31H phthalocyanine (2) shown in FIGS. 5a) and b) respectively were used in a blend.

The blend was deposited on a glass substrate with hetero-interdigit electrode made of indium tin oxide (ITO) and aluminum (Al). The fingers are 5 μm in width, 5 mm in length and 50 nm in high and 100 nm in height and the distance between two ITO-Al fingers is 5 μm. The structure is shown in FIGS. 8a) and 8b).

10 mg/ml chloroform solution of 1 and 2 (see FIG. 5) in molar ratio 1:1 was prepared. A dip casting apparatus was used to obtain oriented discotic liquid crystals layers. The apparatus is shown in FIG. 9.

In order to control the hydrophobicity of the glass the substrates were silanised with the propyl trimethoxy silane before coating with the discotic liquid crystals.

The dipping direction is such, that the columns should orient perpendicular to the electrode fingers, but in plane with the glass surface.

The dipper is controlled via software, and the best films were obtained rising the glass substrate with a speed of 1 mm/s.

Although the alignment obtained using this technique and conditions is not perfect, a considerable degree of orientation could be achieved, as shown in FIG. 10.

The interdigit solar cells thus produced have been characterised under simulated solar radiation (standardised according to AM1.5, 100 mW/cm$^2$) using the sun simulator (1600 W Sun Simulator, Oriel Instruments). The current-voltage characteristic is reported in FIG. 11.

Due to the insufficient insulation during the measurement, the signal/noise ratio is very low. The parameters to describe the solar cells can be extracted from the fit as summarised in table 1.

TABLE 1

| Solar cell characteristic parameters | |
|---|---|
| Jsc [nA/cm$^2$] | 63 |
| Voc [mV] | 510 |
| FF [%] | 25 |
| η [%] | $8 \times 10^{-9}$ |

These values are comparable with others reported about in the literature on discotic materials (see for example Petritsch et al., Solar Energy Materials & Solar Cells, 61 (2000), 63). It has to be borne in mind that the parameters have not been optimized yet and that a considerable enhancement of signal is to be expected.

The features of the present invention disclosed in the specification, the claims and/or in the accompanying drawings, may, both separately, and in any combination thereof, be material for realising the invention in various forms thereof.

The invention claimed is:

1. An electronic device, comprising:
a substrate having a surface,
an electrode array arranged on the surface of the substrate such that parts of the electrode array are arranged in an interdigitating and/or meandering and/or parallel fashion, further characterized in that the parts of the electrode array are electrode fingers, comprising at least three electrode fingers, and that the average distance between two adjacent electrode fingers is in the range of 3 µm-10 µm, at least one layer of at least one discotic liquid crystalline material, the at least one material forming columns, each column having a longitudinal axis, the at least one layer being arranged on the surface of the substrate in a manner such that the longitudinal axes of the columns are parallel to the surface and such that parts of the electrode array are connected to each other through the columns in a conductive manner, the conduction mainly occurring along the longitudinal axes of the columns.

2. The electronic device according to claim 1, characterized in that the columns are aligned uniaxially, with their longitudinal axes being aligned parallel or roughly parallel.

3. The electronic device according to claim 1, characterized in that the electrode array comprises a plurality of electrode fingers.

4. The electronic device according to claim 1, characterized in that the plurality of electrode fingers form at least one comb-like structure.

5. The electronic device according to claim 4, characterized in that the plurality of electrode fingers form two comb-like structures interdigitating with each other, or the plurality of electrode fingers form one comb-like structure and one meander-like structure interdigitating with each other.

6. The electronic device according to claim 5, characterized in that the two comb-like structures lie opposite each other, with the electrode fingers of each comb-like structure facing each other.

7. The electronic device according to claim 1, characterized in that the electrode array is made of at least one metal oxide.

8. The electronic device according to claim 6, characterized in that the electrode array is made of at least one metal.

9. The electronic device according to claim 8, characterized in that the electrode array is made of at least one metal oxide and/or at least one metal.

10. The electronic device according to claim 1, characterized in that the electrode array is made of at least two metals.

11. The electronic device according to claim 7, characterized in that the at least one metal oxide and/or the at least one metal is selected to match the work function of the electronic device.

12. The electronic device according to claim 7, characterized in that the metal(s)/metal oxide(s)/is (are) selected from the group comprising gold, silver, aluminum, iron, copper, platinum, zinc, tin, calcium, magnesium, indium doped tin oxide (ITO), fluorine doped tin oxide (FTO), doped zinc oxide (ZnO), and undoped zinc oxide (ZnO).

13. The electronic device according to claim 1, characterized in that the electrode fingers are made of at least one metal and/or at least one metal oxide, preferably two metals and/or two metal oxides.

14. The electronic device according to claim 1, characterized in that the average distance between two adjacent electrode fingers is 5 µm.

15. The electronic device according to claim 1, characterized in that there are two or more layers of the same or different discotic liquid crystalline material, wherein one layer is on top of the other layer of discotic liquid crystalline material.

16. The electronic device according to claim 1, characterized in that the substrate is selected from the group comprising glass, quartz, flexible substrates (e.g. polyethylene terephthalate (PET), polyethylene naphthalate (PEN), polyethersulfone (PES), stainless steel), and silicon.

17. The electronic device according to claim 16, characterized in that the substrate has been surface modified.

18. The electronic device according to claim 17, characterized in that the substrate has been surface modified, to achieve uniaxial alignment.

19. The electronic device according to claim 2, characterized in that the uniaxial alignment of columns with the axes being parallel aligned, is achieved by doctor blading, shearing, rubbing, zone casting and/or orientation by laser irradiation, exposition to magnetic field, drop casting, spin coating, Langmuir-Blodgett-techniques, Langmuir-Schäfer-techniques, self-assembling of or at unmodified and/or modified substrates.

20. Use of an electronic device according to claim 1 as a solar cell, a field effect transistor, a sensor and/or a light emitting diode.

21. A method of fabricating an electronic device, comprising the steps:
   a) providing a substrate having a surface,
   b) depositing at least one layer of a discotic liquid crystalline material on the surface, the at least one layer of a discotic liquid crystalline material is aligned such that columns of the discotic liquid crystalline material are formed, each column having a longitudinal axis, and such that the longitudinal axes of the columns are parallel to the surface of the substrate,
   c) depositing an electrode array on the surface such that parts of the electrode array are arranged in an interdigitating and/or meandering and/or parallel fashion, the parts of the electrode array being electrode fingers, comprising at least three electrode fingers, and such that parts of the electrode array are connected to each other through the columns in a conductive manner, said conduction mainly occurring along the longitudinal axes of the columns, characterized in that steps b) and c) are in reverse order.

* * * * *